United States Patent
Erickson et al.

(10) Patent No.: US 10,236,050 B2
(45) Date of Patent: *Mar. 19, 2019

(54) OPTIMIZING DATA APPROXIMATION ANALYSIS USING LOW POWER CIRCUITRY

(71) Applicant: International Business Machines Corporation, Armonk, NY (US)

(72) Inventors: Karl R. Erickson, Rochester, MN (US); Phil C. Paone, Rochester, MN (US); George F. Paulik, Rochester, MN (US); David P. Paulsen, Inver Grove Heights, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/001,420

(22) Filed: Jun. 6, 2018

(65) Prior Publication Data

US 2018/0350423 A1    Dec. 6, 2018

Related U.S. Application Data

(63) Continuation of application No. 15/612,316, filed on Jun. 2, 2017, now Pat. No. 10,037,792.

(51) Int. Cl.
*G11C 11/24* (2006.01)
*G11C 11/40* (2006.01)

(52) U.S. Cl.
CPC ............ *G11C 11/24* (2013.01); *G11C 11/40* (2013.01)

(58) Field of Classification Search
CPC ............................... G11C 11/24; G11C 11/40
See application file for complete search history.

(56) References Cited

U.S. PATENT DOCUMENTS 3,076,933 A    2/1963   Negrete
4,561,089 A    12/1985  Rouse et al.
(Continued)

OTHER PUBLICATIONS

Carstens, *Open Bit Line Sensing: Writing Dummy Cells for Test Purpose*, An IP.com Prior Art Database Technical Disclosure, IP.com No. IPCOM000174809D, Qimonda 2008, Original Publication Date: Oct. 13, 2008, 2 pages.

(Continued)

*Primary Examiner* — Tri M Hoang
(74) *Attorney, Agent, or Firm* — Joseph D. Downing; Nathan M. Rau; Kennedy Lenart Spraggins LLP (57) ABSTRACT

Optimizing data approximation analysis using low power circuitry including receiving a first set of data results and a second set of data results; charging a first capacitor on the circuit with a unit of charge for each of the first set of data results that indicates a positive data point; charging a second capacitor on the circuit with the unit of charge for each of the second set of data results that indicates a positive data point; applying a voltage from the first capacitor and a voltage from the second capacitor to a FET on the circuit, wherein a current flows through the FET toward an output of the circuit if the voltage on the first capacitor is greater than the voltage on the second capacitor and a difference in the voltage of the first capacitor and the second capacitor is greater than a threshold voltage of the FET.

13 Claims, 6 Drawing Sheets

(56) References Cited

U.S. PATENT DOCUMENTS

| | | | |
|---|---|---|---|
| 4,800,518 | A | 1/1989 | Miller |
| 4,802,103 | A | 1/1989 | Faggin et al. |
| 5,376,915 | A | 12/1994 | Takeuchi et al. |
| 5,497,121 | A | 3/1996 | D'Hont |
| 5,768,501 | A | 6/1998 | Lewis |
| 6,081,468 | A | 6/2000 | Taira et al. |
| 6,130,568 | A * | 10/2000 | Kwon .................... G05F 3/242 327/307 |
| 6,982,431 | B2 | 1/2006 | Modlin et al. |
| 7,084,695 | B2 | 8/2006 | Porter |
| 7,111,260 | B2 | 9/2006 | Visweswariah |
| 7,139,743 | B2 | 11/2006 | Indeck et al. |
| 8,909,592 | B2 | 12/2014 | Stergiou et al. |
| 9,000,837 | B1 | 4/2015 | Fifield |
| 9,082,495 | B2 | 7/2015 | Lee et al. |
| 9,093,175 | B2 | 7/2015 | Barth, Jr. et al. |
| 9,147,144 | B2 | 9/2015 | Potyrailo et al. |
| 9,147,457 | B2 | 9/2015 | Kim et al. |
| 9,367,853 | B2 | 6/2016 | Cronin et al. |
| 9,411,009 | B1 | 8/2016 | Aguayo Gonzalez et al. |
| 9,478,303 | B1 | 10/2016 | Parker |
| 9,508,424 | B2 | 11/2016 | Lee |
| 9,916,890 | B1 | 3/2018 | Erickson et al. |
| 10,037,792 | B1 * | 7/2018 | Erickson .............. G11C 29/021 |
| 10,043,568 | B1 * | 8/2018 | Erickson .............. G11C 29/021 |
| 2002/0159319 | A1 | 10/2002 | Kirihata et al. |
| 2007/0070754 | A1 | 3/2007 | Vogelsang |
| 2008/0313510 | A1 | 12/2008 | Baker |
| 2014/0122925 | A1 | 5/2014 | Peake et al. |
| 2014/0201426 | A1 | 7/2014 | Ma |
| 2015/0016193 | A1 | 1/2015 | Lewis et al. |
| 2015/0281612 | A1 * | 10/2015 | Lund .................... H04N 5/3559 250/214 P |
| 2017/0220918 | A1 * | 8/2017 | Entner ............. G06K 19/06028 |
| 2018/0218766 | A1 | 8/2018 | Erickson et al. |
| 2018/0240512 | A1 | 8/2018 | Erickson et al. |

OTHER PUBLICATIONS

Kozma et al., *A Low-Power Current-Mode Correlation Detector with Analog Data Storage*, 2004 IEEE Region 10 Conference (TENCON 2004), Nov. 2004, vol. 2, pp. 442-445, IEEE Xplore Digital Library (ieee.org) online, DOI: 10.1109/TENCON.2004. 1414627, URL: ieeexplore.ieee.org/abstract/document/1414627/.

*Voltage Comparator, Chapter 6—Analog Integrated Circuits*, All About Circuits, Electronics Textbook, <https://www.allaboutcircuits.com/textbook/experiments/chpt-6/voltage-comparator/>, EETech Media, LLC, printed Mar. 10, 2017, 3 pages.

U.S. Appl. No. 15/612,272, to Karl R. Erickson et al., entitled, *Real Time Cognitive Reasoning Using a Circuit with Varying Confidence Level Alerts*, assigned to International Business Machines Corporation, 41 pages, filed June 2, 2017.

U.S. Appl. No. 15/612,360, to Karl R. Erickson et al., entitled, *Cognitive Analysis Using Applied Analog Circuits*, assigned to International Business Machines Corporation, 37 pages, filed Jun. 2, 2017.

U.S. Appl. No. 15/612,433, to Karl R. Erickson et al., entitled, *Real Time Cognitive Monitoring of Correlations Between Variables*, assigned to International Business Machines Corporation, 41 pages, filed Jun. 2, 2017.

U.S. Appl. No. 15/820,301, to Karl R. Erickson et al., entitled, *Real Time Cognitive Monitoring of Correlations Between Variables*, assigned to International Business Machines Corporation, 41 pages, filed Nov. 21, 2017.

U.S. Appl. No. 15/818,929, to Karl R. Erickson et al., entitled, *Cognitive Analysis Using Applied Analog Circuits*, assigned to International Business Machines Corporation, 37 pages, filed Nov. 21, 2017.

U.S. Appl. No. 15/818,977, to Karl R. Erickson et al., entitled, *Real Time Cognitive Reasoning Using a Circuit with Varying Confidence Level Alerts*, assigned to International Business Machines Corporation, 42 pages, filed Nov. 21, 2017.

U.S. Appl. No. 16/000,207, to to Karl R. Erickson et al., entitled, *Optimizing Data Approximation Analysis Using Low Power Circuitry*, assigned to International Business Machines Corporation, 34 pages, filed Jun. 5, 2018.

AU8820160894US03, Appendix P; List of IBM Patent or Applications Treated as Related, Sep. 14, 2018, 2 pages.

* cited by examiner

OPTIMIZING DATA APPROXIMATION ANALYSIS USING LOW POWER CIRCUITRY

CROSS-REFERENCE TO RELATED APPLICATION

This application is a continuation application of and claims priority from U.S. patent application Ser. No. 15/612,316, filed Jun. 2, 2017.

BACKGROUND

Field of the Invention

The field of the invention is data processing, or, more specifically, methods, apparatus, and products for optimizing data approximation analysis using low power circuitry.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for optimizing data approximation analysis using low power circuitry are disclosed in this specification. Optimizing data approximation analysis using low power circuitry includes receiving, by a circuit, a first set of data results and a second set of data results; charging a first capacitor on the circuit with a unit of charge for each of the first set of data results that indicates a positive data point; charging a second capacitor on the circuit with the unit of charge for each of the second set of data results that indicates a positive data point; applying a voltage from the first capacitor and a voltage from the second capacitor to a field effect transistor (FET) on the circuit, wherein a current flows through the FET toward an output of the circuit if the voltage on the first capacitor is greater than the voltage on the second capacitor and a difference in the voltage of the first capacitor and the second capacitor is greater than a threshold voltage of the FET; and generating a signal on the output of the circuit to indicate that the positive data points in the first set of data results is greater than the positive data points in the second set of data results and that a difference between the positive data points in the first set of data results and the positive data points in the second set of data results is greater than a probability range.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
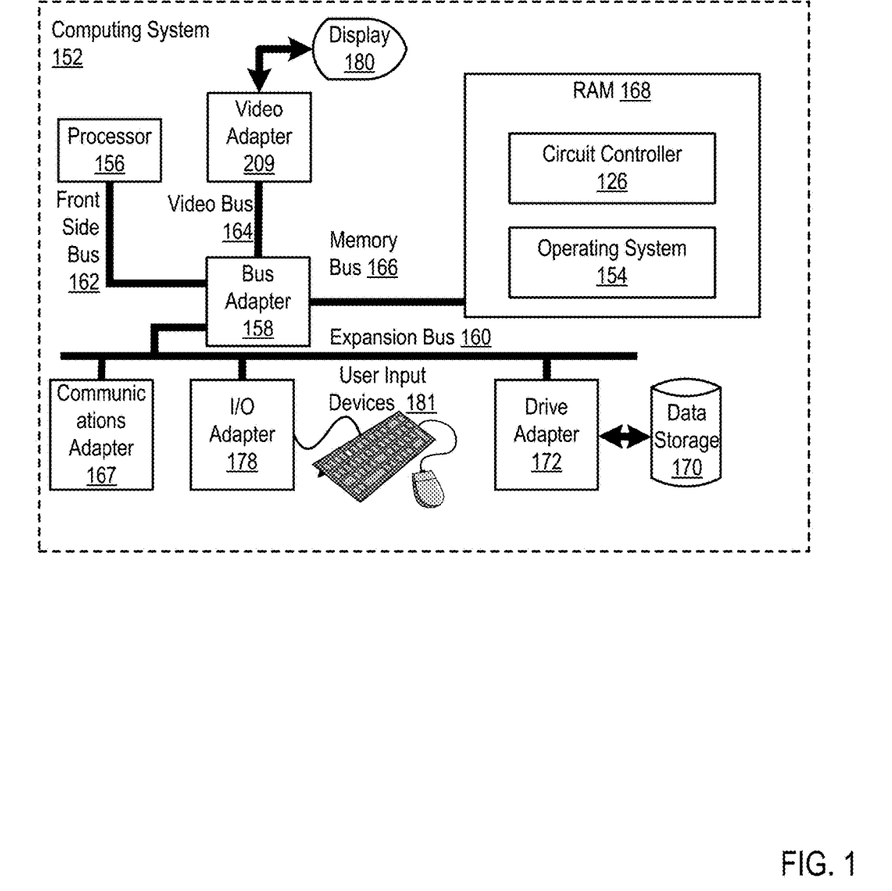
FIG. 1 sets forth a block diagram of an example system configured for optimizing data approximation analysis using low power circuitry according to embodiments of the present invention.

Exemplary methods, apparatus, and products for optimizing data approximation analysis using low power circuitry in accordance with the present invention are described with reference to the accompanying drawings, beginning with FIG. 1. FIG. 1 sets forth a block diagram of automated computing machinery comprising an exemplary computing system (152) configured for optimizing data approximation analysis using low power circuitry according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for optimizing data approximation analysis using low power circuitry according to embodiments of the present invention include UNIX™, Linux™, Microsoft XP™, AIX™, IBM's i OS™, and others as will occur to those of skill in the art. The operating system (154) in the example of FIG. 1 is shown in RAM (168), but many components of such software typically are stored in non-volatile memory also, such as, for example, on a disk drive (170). Also stored in RAM (168) is a circuit controller (126), a module of computer program instructions for optimizing data approximation analysis using low power circuitry.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for optimizing data approximation analysis using low power circuitry according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for optimizing data approximation analysis using low power circuitry according to embodiments of the present invention include modems for wired dial-up communications, Ethernet (IEEE 802.3) adapters for wired data communications, and 802.11 adapters for wireless data communications.

Figure 2:
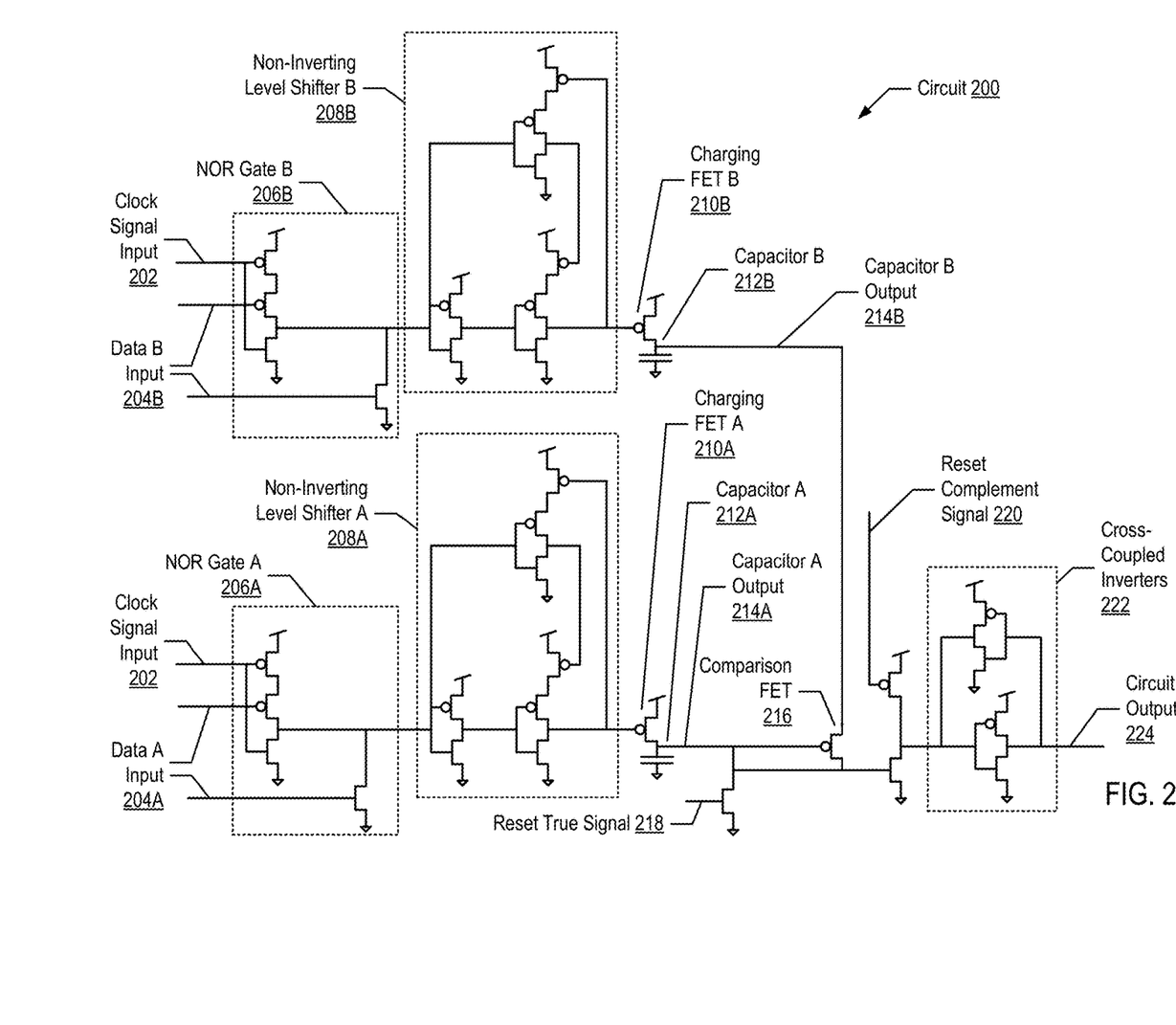
FIG. 2 sets forth a circuit configured for optimizing data approximation analysis using low power circuitry according to embodiments of the present invention.

FIG. 2 shows elements of an example circuit (200) configured for optimizing data approximation analysis using low power circuitry in accordance with the present invention. As shown in FIG. 2, the exemplary circuit (200) includes clock signal inputs (202), data A input (204A), data B input (204B), NOR gate A (206A), NOR gate B (206B), non-inverting level shifter A (208A), non-inverting level shifter B (208B), charging field effect transistor (FET) A (210A), charging FET B (210B), capacitor A (212A), capacitor B (212B), capacitor A output (214A), capacitor B output (214B), comparison FET (216), reset true signal (218), reset complement signal (220), cross-coupled inverters (222), and a circuit output (224).

The example circuit, in general, may be configured to receive two sets of binary data via data A input (204A) and data B input (204B). For each positive data point (i.e., '1's or high bits) in each set of data, a unit of charge is placed on the corresponding capacitor (capacitor A (212A), capacitor B (212B)), resulting in a charge on each capacitor that corresponds to the number of positive data points in each data set. The voltages on each capacitor (capacitor A (212A), capacitor B (212B)) are then compared via the comparison FET (216). The example circuit then provides an output that indicates whether the voltage on the capacitor A output (214A) minus the voltage on the capacitor B output (214B) is greater than the threshold voltage of the comparison FET (216). Consequently, the circuit output (224) indicates whether the number of positive data points presented in data A input (204A) is greater than the number of positive data points presented in data B input (204B), and whether the difference corresponds to a threshold number of units of charge. The above may be summarized with the following formula: if $V_A - V_B > V_T$, then the circuit output (224) presents a positive data point, otherwise the circuit output (224) presents a negative data point (i.e., a '0' or low bit), where $V_A$ is the capacitor A output (214B), $V_B$ is capacitor B output (214B), and $V_T$ is the threshold voltage of the comparison FET (216).

The clock signal inputs (202) are pins or other input wires configured to receive a timed clock pulse as one input into the NOR gates (NOR gate A (206A), NOR gate B (206B)). The data inputs (data A input (204A), data B input (204B)) are pins or other input wires configured to receive signals corresponding to the data bits in the set of data results, such as signals corresponding to a positive data point, and a signal corresponding to a negative data point. A high bit on the data input will pull up the clock signal input, and a low bit on the data input will pull down the clock signal input. The data bits may be received as voltages corresponding to high data bits and low data bits. Further, the set of data results may be a very large data set comprising hundreds, thousands, or millions of data bits in a very short time period. Each data bit in the set of data results may represent a result in the form of a high bit (positive) or a low bit (negative). Each set of data results may be applied to the data inputs (data A input (204A), data B input (204B)) by a circuit controller.

The non-inverting level shifters (non-inverting level shifter A (208A), non-inverting level shifter B (208B)) receive the pulse from the NOR gates (NOR gate A (206A), NOR gate B (206B)), uplift the voltage of the pulse, and apply the pulse to the charging FETs (charging FET A (210A), charging FET B (210B)). Each pulse received from the NOR gates (NOR gate A (206A), NOR gate B (206B)) indicating a high bit is adjusted to have the same magnitude as all other pulses. The non-inverting level shifters (non-inverting level shifter A (208A), non-inverting level shifter B (208B)) may increase the voltage (for example, from 0.7V to 1.5V) resulting in a greater linear region within the capacitor for storing units of charge.

The charging FETs (charging FET A (210A), charging FET B (210B)) are configured to put a unit of charge onto the capacitors (capacitor A (212A), capacitor B (212B)) for each clocked-timed pulse received from the non-inverting level shifters (non-inverting level shifter A (208A), non-inverting level shifter B (208B)). The capacitors (capacitor A (212A), capacitor B (212B)) receive units of charge from the charging FETs (charging FET A (210A), charging FET B (210B)) and store the resulting total charge. The resulting capacitor output voltage is placed on the capacitor outputs (capacitor A output (214A), capacitor B output (214B)). The charging FETs (charging FET A (210A), charging FET B (210B)) are each activated based upon the inputs (i.e., source and ground) received on each charging FET. The unit of charge placed on the capacitors (capacitor A (212A), capacitor B (212B)) for each '1' received in the set of data may be altered by changing the input received by the charging FETs (e.g., the length of the clock pulse). The charging FETs (charging FET A (210A), charging FET B (210B)) may be p-channel FETs.

The capacitor outputs (capacitor A output (214A), capacitor B output (214B)) are coupled to the comparison FET (216) such that a current flows through the comparison FET (216) if the voltage on capacitor A output (214A) is greater than the voltage received on capacitor B output (214B), and if the difference of the voltage on capacitor A output (214A) and the capacitor B output (214B) is greater than the threshold voltage of the comparison FET (216). The voltage on capacitor A (212A) must exceed the voltage on capacitor B (212B) by an amount of voltage sufficient to overcome the threshold voltage of the comparison FET (216) in order to trigger a voltage transfer to the cross-coupled inverters (222). The comparison FETs (216) may be a p-channel FET.

Each capacitor (capacitor A (212A), capacitor B (212B)) may be provided a baseline charge prior to receiving the units of charge resulting from the corresponding sets of data results. The baseline charge may be placed on the capacitors to ensure that an output is triggered in the event of a very low number of units of charge. For example, data B input (204B) may receive no positive data points ('1's or high bits) and data A input (204A) may receive only an amount of positive data points that corresponding to a number of units of charge sufficient to overcome the threshold voltage of the comparison FET (216). In this case, the baseline charge ensures that the comparison FET (216) registers that the voltage threshold has been exceeded and the circuit output (224) registers an appropriate result.

The reset true signal (218) and the reset complement signal (220) are pins or other input wires configured to reset the charge on the capacitors (capacitor A (212A), capacitor B (212B)). The reset true signal (218) and the reset complement signal (220) trigger the reset circuitry on the circuit (200) that discharges the capacitors (capacitor A (212A), capacitor B (212B)) and clears any result stored in the cross-coupled inverters (222). The reset circuitry may be triggered, for example, by a circuit controller based on the number of samples received, the number of positive data point results received, or manually by a user.

The cross-coupled inverters (222) store the result of whether the voltage on the capacitor A output (214A) minus the voltage on the capacitor B output (214B) is greater than the threshold voltage of the comparison FET (216). Any output of the comparison FET (216) activates a pulldown FET that will change the state of the cross-coupled inverters (222). This change of state of the cross-coupled inverters (222) may be read (e.g., by a circuit controller) via the circuit output (224) as indicating whether a statistically significant result has been found. The change of state of the cross-coupled inverters (222) may also trigger the reset circuitry to set the voltage of the capacitors (capacitor A (212A), capacitor B (212B)) to zero or the baseline charge.

For example, assume that the circuit (200) receives two sets of data results: data A consisting of '1011010111' and data B consisting of '0010010000'. Assume further that the circuit (200) is configured to place units of charge of 0.1V for each positive data point received on the data inputs. Further, assume that each capacitor is provided a baseline charge of 0.3V, and that the threshold voltage of the comparison FET (216) is 0.3V.

After ten clock cycles during which data A is applied to the circuit via data A input (204A) and data B is applied to the circuit via data B input (204B), the voltage stored on capacitor A (202A) would be 1.0V, which is 0.3V plus seven units of charge of 0.1V each. The voltage stored on capacitor B (202B) would be 0.5V, which is 0.3V plus two units of charge of 0.1V each.

In this example, the voltage on capacitor A output (214A) (1.0V) is greater than the voltage on capacitor B output (214B) (0.5V). Also, the difference in the voltage on capacitor A output (214A) (1.0V) and capacitor B output (214B) (0.5V) is greater than the threshold voltage of the comparison FET (216) (0.3V). Therefore, the signal on the circuit output (224) will be a '1' or a high bit.

Figure 3:
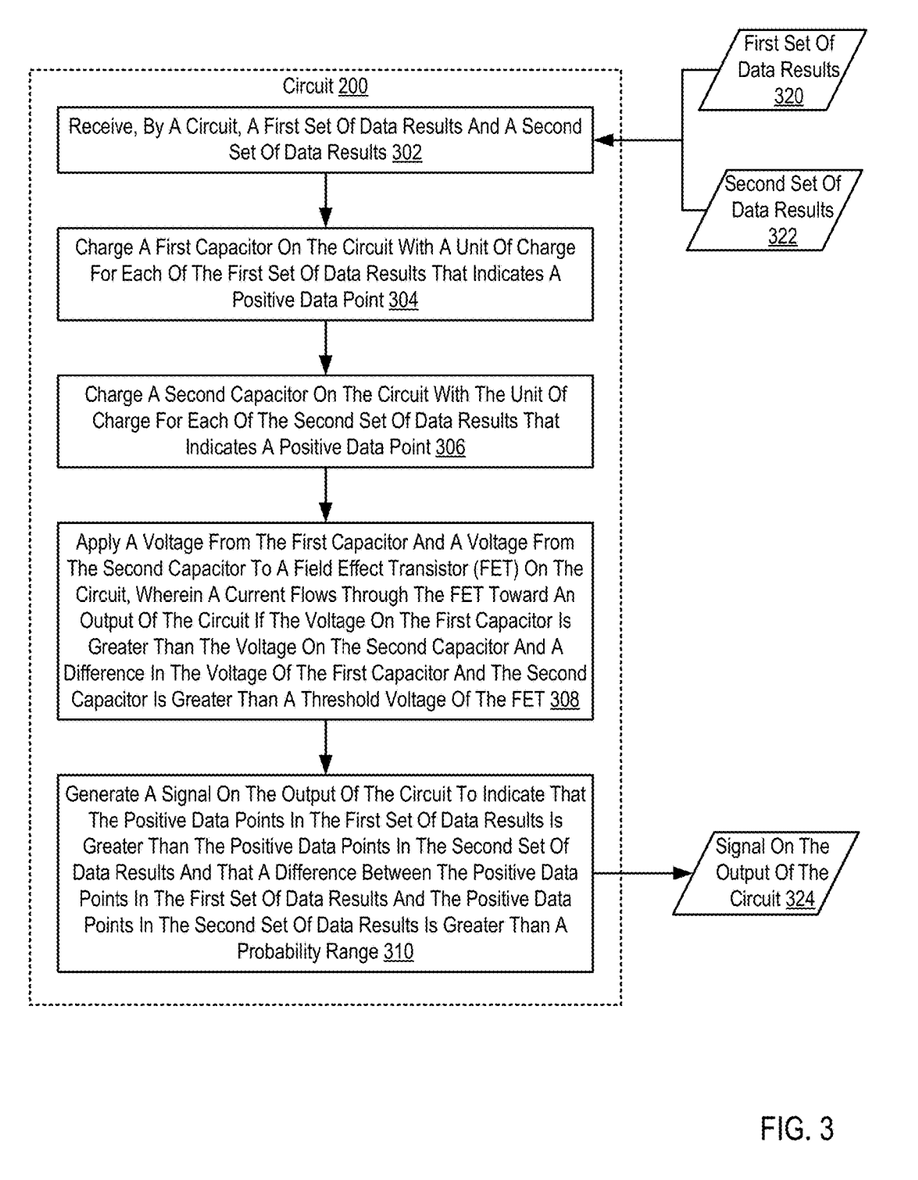
FIG. 3 sets forth a flow chart illustrating an exemplary method for optimizing data approximation analysis using low power circuitry according to embodiments of the present invention.

For further explanation, FIG. 3 sets forth a flow chart illustrating an exemplary method for optimizing data approximation analysis using low power circuitry according to embodiments of the present invention that includes receiving (302), by a circuit (200), a first set of data results (320) and a second set of data results (322). Receiving (302), by a circuit (200), a first set of data results (320) and a second set of data results (322) may be carried out by applying the first set of data results (320) to a first data input of the circuit and the second set of data results (322) to a second data input of the circuit. Each set of data results (first set of data results (320), second set of data results (322)) indicate a type of relationship between two or more tests performed under the same conditions. Specifically, the positive data points in the first set of data results indicate a first type of relationship between a first test and a second test, and wherein the positive data points in the second set of data results indicate a second type of relationship between the first test and the second test. Further, the first data point in each of the first set of data results and the second set of data results refers to the relationship between different tests performed under the same conditions (e.g., test performed on the same die).

For example, a set of non-yielding dies may undergo tests to determine whether certain circuits within the die match the specification for the die. Test 1 may be to determine whether a resistance for "via1" matches the specification, and test 2 may be to determine whether a resistance for "m1" matches the specification. Given the two tests, there are four types of relationships possible between test 1 and test 2: test 1 fails and test 2 fails (0,0), test 1 fails and test 2 passes (0,1), test 1 passes and test 2 fails (1,0), and test 1 passes and test 2 passes (1,1). For each die, one of the four relationships will result from the results of test 1 and test 2.

Given the four test relationships, data results can be generated. Data result A determines whether "via1" resistance and m1 resistance are both out of spec (i.e., is the test 1/test 2 relationship equal to (0,0)). Data result B determines whether "via1" resistance is out of spec and m1 resistance is in spec (i.e., is the test 1/test 2 relationship equal to (0,1)). Data result C determines whether "via1" resistance is in spec and "m1" resistance is out of spec (i.e., is the test 1/test 2 relationship equal to (1,0)). Data result D determines whether "via1" resistance and "m1" resistance are both in spec (i.e., is the test 1/test 2 relationship equal to (1,1)). Data result D may be ignored because the occurrence of both test 1 and test 2 passing may not be relevant to determining correlations between failing tests on non-yielding dies.

For each test1/test2 relationship, each data result will have corresponding results. For the test1/test2 relationship (0,0), data result A will be '1' (positive), data result B will be '0' (negative), data result C will be '0' (negative), and data result D will be '0' (negative). For the test1/test2 relationship (0,1), result A will be '0' (negative), data result B will be '1' (positive), data result C will be '0' (negative), and data result D will be '0' (negative). For the test1/test2 relationship (1,0), data result A will be '0' (negative), data result B will be '0' (negative), data result C will be '1' (positive), and data result D will be '0' (negative). Finally, for the test1/test2 relationship (1,1), data result A will be '0' (negative), data result B will be '0' (negative), data result C will be '0' (negative), and data result D will be '1' (positive). The above example may be summarized using the following table:

TABLE 1

| Test 1 | Test 2 | Data Result A | Data Result B | Data Result C | Data Result D |
|--------|--------|---------------|---------------|---------------|---------------|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

The circuit may be utilized to determine (very quickly and using little power) whether one data result occurs more frequently to a statistically significant degree than another data result. To that end, if two tests are performed on each of a set of conditions (e.g., a set of dies or computer chips), six comparisons may be made using the circuit: data result A-data result B, data result A-data result C, data result B-data result A, data result B-data result C, data result C-data result A, and data result C-data result B. Once again, data result D may be ignored because the occurrence of both test 1 and test 2 passing may not be relevant to determining correlations between failing tests on non-yielding dies.

The method of FIG. 3 also includes charging (304) a first capacitor on the circuit (200) with a unit of charge for each of the first set of data results (320) that indicates a positive data point. Charging (304) a first capacitor on the circuit (200) with a unit of charge for each of the first set of data results (320) that indicates a positive data point may be carried out by applying the first set of data results (320) to the data A input of the circuit. The first set of data results may be applied to the first capacitor with the clock pulses via a NOR gate and a non-inverting level shifter. Each positive result in the first set of data results causes one unit of charge to be placed on the first capacitor.

The method of FIG. 3 also includes charging (306) a second capacitor on the circuit (200) with the unit of charge for each of the second set of data results (322) that indicates a positive data point. Charging (306) a second capacitor on the circuit (200) with the unit of charge for each of the second set of data results (322) that indicates a positive data point may be carried out by applying the second set of data results (322) to the data B input of the circuit. The second set of data results may be applied to the second capacitor with the clock pulses via a NOR gate and a non-inverting level shifter. Each positive result in the second set of data results causes one unit of charge to be placed on the second capacitor.

The first capacitor and the second capacitor may be charged simultaneously or near-simultaneously. For example, if the first data point for each of the first set of data results (320) and the second set of data results (322) is positive, then a unit of charge may be placed on both the first capacitor and the second capacitor with the same clock pulse and at the same time or nearly the same time.

The method of FIG. 3 also includes applying (308) a voltage from the first capacitor and a voltage from the second capacitor to a field effect transistor (FET) on the circuit (200), wherein a current flows through the FET toward an output of the circuit if the voltage on the first capacitor is greater than the voltage on the second capacitor and a difference in the voltage of the first capacitor and the second capacitor is greater than a threshold voltage of the FET. Applying (308) a voltage from the first capacitor and a voltage from the second capacitor to a field effect transistor (FET) on the circuit (200), wherein a current flows through the FET toward an output of the circuit if the voltage on the first capacitor is greater than the voltage on the second capacitor and a difference in the voltage of the first capacitor and the second capacitor is greater than a threshold voltage of the FET may be carried out by the voltage on the first capacitor being applied to one terminal of a comparison FET, such as the gate terminal and the voltage on the second capacitor being applied to another terminal of the comparison FET, such as the source or drain terminals. If the voltage on the first capacitor is greater than the voltage on the second capacitor and a difference in the voltage of the first capacitor and the second capacitor is greater than a threshold voltage of the comparison FET, a positive or high bit may be transferred to a group of cross-coupled inverters.

The method of FIG. 3 also includes generating (310) a signal on the output of the circuit (324) to indicate that the positive data points in the first set of data results (320) is greater than the positive data points in the second set of data results (322) and that a difference between the positive data points in the first set of data results (320) and the positive data points in the second set of data results (322) is greater than a probability range. Generating (310) a signal on the output of the circuit (324) to indicate that the positive data points in the first set of data results (320) is greater than the positive data points in the second set of data results (322) and that a difference between the positive data points in the first set of data results (320) and the positive data points in the second set of data results (322) is greater than a probability range may be carried out by a group of cross-coupled inverters receiving a positive or high bit from the comparison FET. The cross-coupled inverters may store a positive or high bit, if received, until reset circuitry is triggered.

The probability range is a statistically significant difference in the number of positive data points between the two sets of data results being compared. If the difference in the number of positive data points exceeds the probability range, the difference may be determined to be statistically significant. For example, if the first set of data results has 10 positive data points, and the second set of data results has 11, the difference of one positive data point may be within the probability range and may not be statistically significant. As another example, if the first set of data results has 10 positive data points, and the second set of data results has 17, the difference of seven positive data point may be outside the probability range and may be statistically significant. The probability range may be determined mathematically based on the requirements of the system.

As an example, a circuit (200) may be used to determine whether the occurrence of dies in which "via1" resistance is out of spec and m1 resistance is in spec (first set of data results (320)) is more frequent than dies in which "via1" resistance is in spec and "m1" resistance is out of spec (second set of data results (322)). A sample of 100 data results in each set may be used, and a probability range of 12 positive data points may be used to determine statistical significance. The unit of charge for each positive data point and the voltage threshold of the comparison FET may be set based on the targeted probability range. Once the sets of data results are applied to the circuit (200), the circuit output may indicate that the positive data points in the first set of data results (320) is greater than the positive data points in the second set of data results (322) and that a difference between the positive data points in the first set of data results (320) and the positive data points in the second set of data results (322) is greater than a probability range of 12 positive data results. Therefore, based on this sample of 100 data results, the occurrence of dies in which "via1" resistance is out of spec and m1 resistance is in spec is more frequent to a statistically significant degree than dies in which "via1"

resistance is in spec and "m1" resistance is out of spec. With this information, the die manufacturing system may be adjusted to address the issue.

Figure 4:
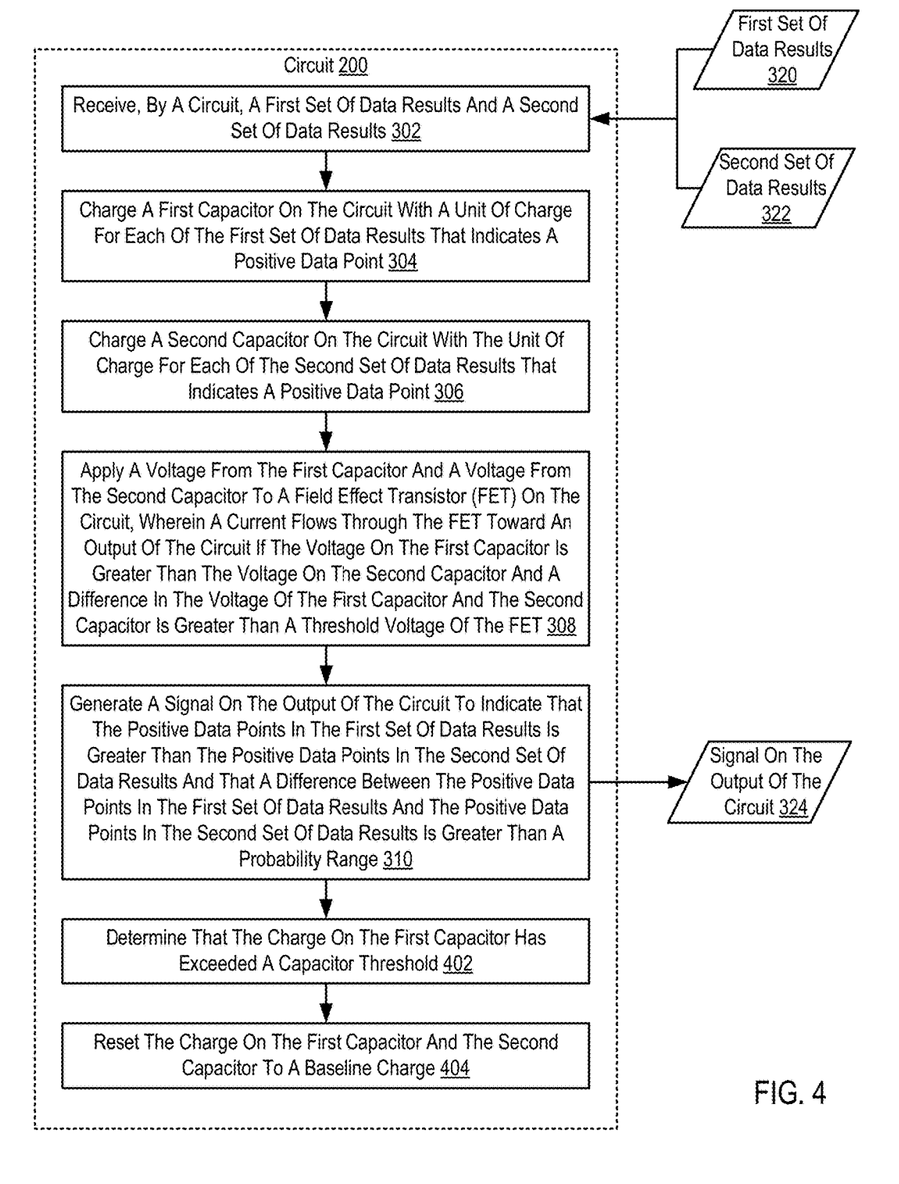
FIG. 4 sets forth a flow chart illustrating an exemplary method for optimizing data approximation analysis using low power circuitry according to embodiments of the present invention.

For further explanation, FIG. 4 sets forth a flow chart illustrating a further exemplary method for optimizing data approximation analysis using low power circuitry according to embodiments of the present invention that includes receiving (302), by a circuit (200), a first set of data results (320) and a second set of data results (322); charging (304) a first capacitor on the circuit (200) with a unit of charge for each of the first set of data results (320) that indicates a positive data point; charging (306) a second capacitor on the circuit (200) with the unit of charge for each of the second set of data results (322) that indicates a positive data point; applying (308) a voltage from the first capacitor and a voltage from the second capacitor to a field effect transistor (FET) on the circuit (200), wherein a current flows through the FET toward an output of the circuit if the voltage on the first capacitor is greater than the voltage on the second capacitor and a difference in the voltage of the first capacitor and the second capacitor is greater than a threshold voltage of the FET; and generating (310) a signal on the output of the circuit (324) to indicate that the positive data points in the first set of data results (320) is greater than the positive data points in the second set of data results (322) and that a difference between the positive data points in the first set of data results (320) and the positive data points in the second set of data results (322) is greater than a probability range.

The method of FIG. 4 differs from the method of FIG. 3, however, in that, the method of FIG. 4 further includes determining (402) that the charge on the first capacitor has exceeded a capacitor threshold; and resetting (404) the charge on the first capacitor and the second capacitor to a baseline charge. Determining (402) that the charge on the first capacitor has exceeded a capacitor threshold may be carried out by obtaining the current charge on the first capacitor and comparing the current charge on the first capacitor to a capacitor threshold. The capacitor threshold may be less than a maximum charge that the first capacitor can hold. Rather, the capacitor threshold may be the maximum charge within a liner region of the first capacitor such that any additional units of charge will cause a different amount of charge to be placed on the first capacitor than the amount of charge placed on the first capacitor by previously applied units of charge.

Resetting (404) the charge on the first capacitor and the second capacitor to a baseline charge may be carried out by adding an amount of charge sufficient to cause a charge to flow through the comparison FET under each intended circumstance. The baseline charge may be placed on the capacitors to ensure that an output is triggered in the event of a very low number of positive data points. The baseline charge ensures that the comparison FET registers that the voltage threshold has been exceeded and the circuit output registers an appropriate result.

Figure 5:
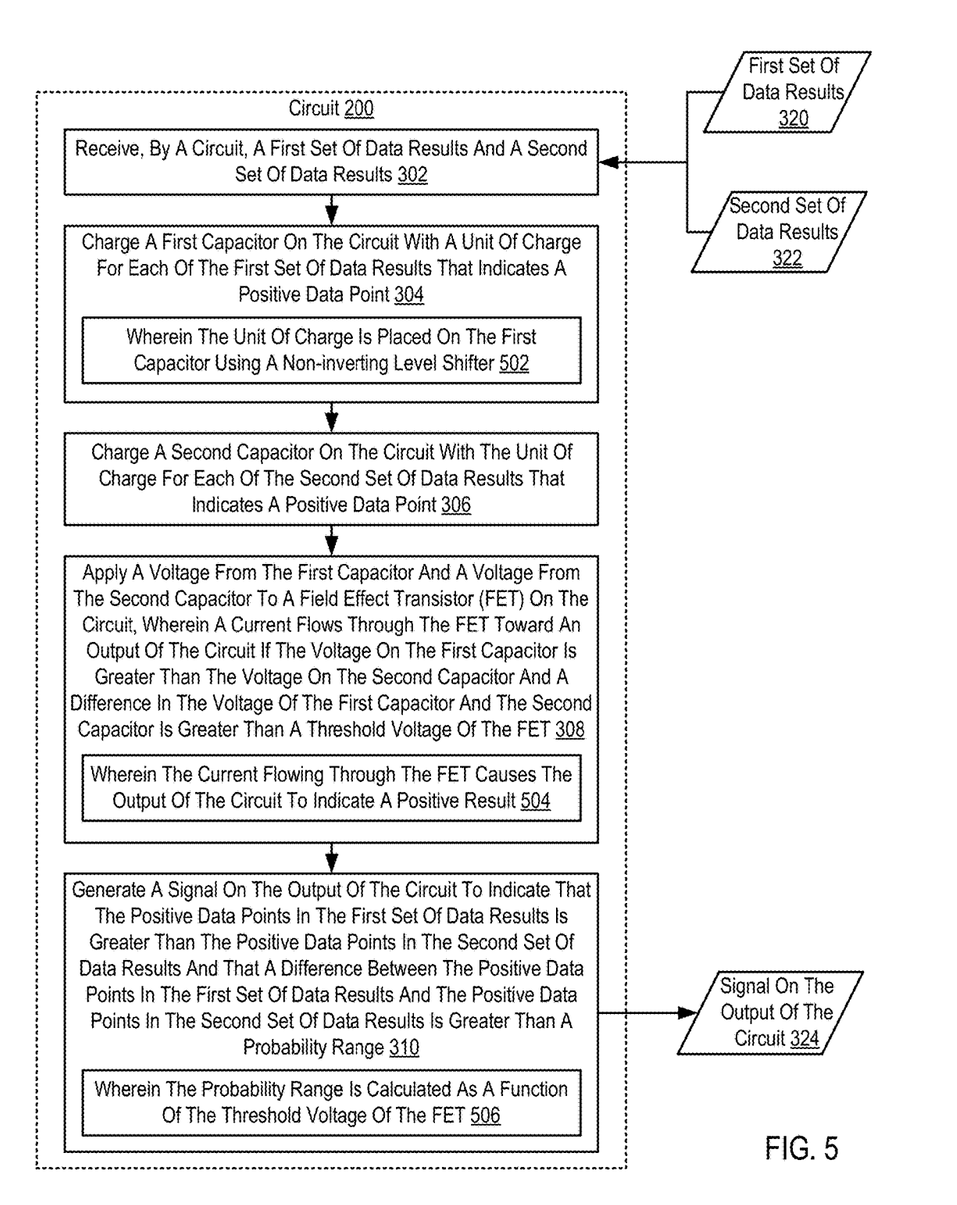
FIG. 5 sets forth a flow chart illustrating an exemplary method for optimizing data approximation analysis using low power circuitry according to embodiments of the present invention.

For further explanation, FIG. 5 sets forth a flow chart illustrating a further exemplary method for optimizing data approximation analysis using low power circuitry according to embodiments of the present invention that includes receiving (302), by a circuit (200), a first set of data results (320) and a second set of data results (322); charging (304) a first capacitor on the circuit (200) with a unit of charge for each of the first set of data results (320) that indicates a positive data point; charging (306) a second capacitor on the circuit (200) with the unit of charge for each of the second set of data results (322) that indicates a positive data point; applying (308) a voltage from the first capacitor and a voltage from the second capacitor to a field effect transistor (FET) on the circuit (200), wherein a current flows through the FET toward an output of the circuit if the voltage on the first capacitor is greater than the voltage on the second capacitor and a difference in the voltage of the first capacitor and the second capacitor is greater than a threshold voltage of the FET; and generating (310) a signal on the output of the circuit (324) to indicate that the positive data points in the first set of data results (320) is greater than the positive data points in the second set of data results (322) and that a difference between the positive data points in the first set of data results (320) and the positive data points in the second set of data results (322) is greater than a probability range.

The method of FIG. 5 differs from the method of FIG. 3, however, in that charging (304) a first capacitor on the circuit (200) with a unit of charge for each of the first set of data results (320) that indicates a positive data point includes wherein (502) the unit of charge is placed on the first capacitor using a non-inverting level shifter. Placing the unit of charge on the first capacitor using a non-inverting level shifter may be carried out by receiving, by the level shifter, a pulse or signal from a data input. The non-inverting level shifter changes the charge of the received signal to match the higher voltage domain of the capacitors. The high voltage domain allows the capacitor to have a greater linear charging region in which units of charge may be placed.

The method of FIG. 5 also differs from the method of FIG. 3, however, in that applying (308) a voltage from the first capacitor and a voltage from the second capacitor to a field effect transistor (FET) on the circuit (200) includes wherein (504) the current flowing through the FET causes the output of the circuit to indicate a positive result. Indicating a positive result on the output of the circuit caused by current flowing through the FET may be carried out by sending a signal to a set of cross-coupled inverters The method of FIG. 5 also differs from the method of FIG. 3, however, in that generating (310) a signal on the output of the circuit (324) to indicate that the positive data points in the first set of data results (320) is greater than the positive data points in the second set of data results (322) and that a difference between the positive data points in the first set of data results (320) and the positive data points in the second set of data results (322) is greater than a probability range includes wherein (506) the probability range is calculated as a function of the threshold voltage of the FET. Calculating the probability range as a function of the threshold voltage of the FET may be carried out by adjusting the clock timing and unit of charge placed on the capacitors such that the threshold voltage of the comparison FET matches the required probability range. A specific probability range (in terms of number of positive data points) may be targeted by adjusting the units of charge corresponding to each positive data point such that the threshold voltage is made equal to the number of positive data points of the probability range.

Figure 6:
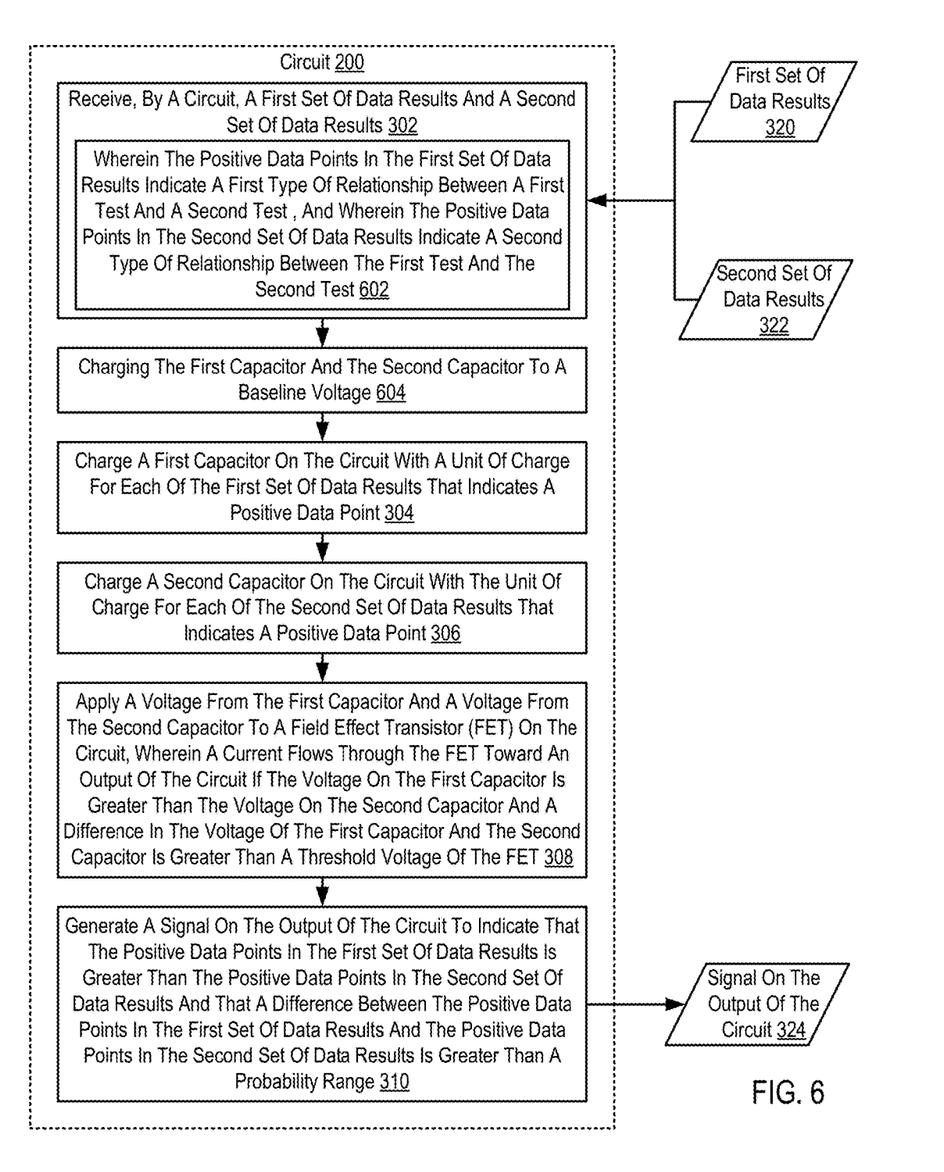
FIG. 6 sets forth a flow chart illustrating an exemplary method for optimizing data approximation analysis using low power circuitry according to embodiments of the present invention.

For further explanation, FIG. 6 sets forth a flow chart illustrating a further exemplary method for optimizing data approximation analysis using low power circuitry according to embodiments of the present invention that includes receiving (302), by a circuit (200), a first set of data results (320) and a second set of data results (322); charging (304) a first capacitor on the circuit (200) with a unit of charge for each of the first set of data results (320) that indicates a positive data point; charging (306) a second capacitor on the circuit (200) with the unit of charge for each of the second set of data results (322) that indicates a positive data point; applying (308) a voltage from the first capacitor and a voltage from the second capacitor to a field effect transistor (FET) on the circuit (200), wherein a current flows through the FET toward an output of the circuit if the voltage on the first capacitor is greater than the voltage on the second capacitor and a difference in the voltage of the first capacitor and the second capacitor is greater than a threshold voltage of the FET; and generating (310) a signal on the output of the circuit (324) to indicate that the positive data points in the first set of data results (320) is greater than the positive data points in the second set of data results (322) and that a difference between the positive data points in the first set of data results (320) and the positive data points in the second set of data results (322) is greater than a probability range.

The method of FIG. 6 differs from the method of FIG. 3, however, in that receiving (302), by a circuit (200), a first set of data results (320) and a second set of data results (322) includes wherein (602) the positive data points in the first set of data results indicate a first type of relationship between a first test and a second test, and wherein the positive data points in the second set of data results indicate a second type of relationship between the first test and the second test.

The method of FIG. 6 differs from the method of FIG. 3, however, in that FIG. 6 further includes charging (604) the first capacitor and the second capacitor to a baseline voltage. Charging (604) the first capacitor and the second capacitor to a baseline voltage may be carried out by applying a charge to each capacitor equivalent to a voltage required to detect the minimum conditions to trigger the circuit output to generate a positive result. Charging (604) the first capacitor and the second capacitor to a baseline voltage may require additional circuitry configured to deliver the baseline charge to the capacitors. Further, the charging (604) the first capacitor and the second capacitor to a baseline voltage may be triggered by the reset circuitry.

In view of the explanations set forth above, readers will recognize that the benefits of optimizing data approximation analysis using low power circuitry according to embodiments of the present invention include:

- Utilizing the physical behavior of FETs to perform data set comparisons with the voltage threshold of FETs acting as a probability range threshold.
- Utilizing custom circuits to perform near-real-time analysis of test results that is orders of magnitude more efficient than traditional methods and requires less time.
- Utilizing custom circuits to quickly and efficiently evaluate large amounts of data to approximate trends and flag anomalies, increasing data evaluation efficiency.

Exemplary embodiments of the present invention are described largely in the context of a fully functional computer system for optimizing data approximation analysis using low power circuitry. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus for optimizing data approximation analysis using low power circuitry, the apparatus comprising a circuit configured to carry out the steps of:
    applying a voltage from a first capacitor and a voltage from a second capacitor to a transistor on the circuit, wherein the first capacitor is charged with a unit of charge for each of a first set of data results that indicates a positive data point, wherein the second capacitor is charged with the unit of charge for each of a second set of data results that indicates a positive data point, and wherein a current flows through the transistor toward an output of the circuit if the voltage on the first capacitor is greater than the voltage on the second capacitor and a difference in the voltages of the first capacitor and the second capacitor is greater than a threshold voltage of the transistor; and
    generating a signal on the output of the circuit to indicate that the positive data points in the first set of data results is greater than the positive data points in the second set of data results and that a difference between the positive data points in the first set of data results and the positive data points in the second set of data results is greater than a probability range.

2. The apparatus of claim 1, the circuit further configured to carry out the steps of:
    determining that the charge on the first capacitor has exceeded a capacitor threshold; and
    resetting the charges on the first capacitor and the second capacitor to a baseline charge.

3. The apparatus of claim 1, wherein the probability range is calculated as a function of the threshold voltage of the transistor.

4. The apparatus of claim 1, wherein the unit of charge is placed on the first capacitor using a non-inverting level shifter.

5. The apparatus of claim 1, wherein the current flowing through the transistor causes the output of the circuit to indicate a positive result.

6. The apparatus of claim 1, wherein the first capacitor and the second capacitor are charged to a baseline voltage before being charged with the unit of charge.

7. The apparatus of claim 1, wherein the positive data points in the first set of data results indicate a first type of relationship between a first test and a second test, and wherein the positive data points in the second set of data results indicate a second type of relationship between the first test and the second test.

8. A computer program product for optimizing data approximation analysis using low power circuitry, the computer program product disposed upon a non-transitory, computer readable medium, the computer program product comprising computer program instructions that, when executed, cause a computer to carry out the steps of:
    applying a voltage from a first capacitor and a voltage from a second capacitor to a transistor on the circuit, wherein the first capacitor is charged with a unit of charge for each of a first set of data results that indicates a positive data point, wherein the second capacitor is charged with the unit of charge for each of a second set of data results that indicates a positive data point, and wherein a current flows through the transistor toward an output of the circuit if the voltage on the first capacitor is greater than the voltage on the second capacitor and a difference in the voltages of the first capacitor and the second capacitor is greater than a threshold voltage of the transistor; and generating a signal on the output of the circuit to indicate that the positive data points in the first set of data results is greater than the positive data points in the second set of data results and that a difference between the positive data points in the first set of data results and the positive data points in the second set of data results is greater than a probability range.

9. The computer program product of claim 8, wherein the computer program instructions, when executed, further cause the computer to carry out the steps of:

determining that the charge on the first capacitor has exceeded a capacitor threshold; and resetting the charges on the first capacitor and the second capacitor to a baseline charge.

10. The computer program product of claim 8, wherein the probability range is calculated as a function of the threshold voltage of the transistor.

11. The computer program product of claim 8, wherein the unit of charge is placed on the first capacitor using a non-inverting level shifter.

12. The computer program product of claim 8, wherein the current flowing through the transistor causes the output of the circuit to indicate a positive result.

13. The computer program product of claim 8, wherein the first capacitor and the second capacitor are charged to a baseline voltage before being charged with the unit of charge.

* * * * *